(12) United States Patent
Reeves et al.

(10) Patent No.: US 10,013,506 B2
(45) Date of Patent: Jul. 3, 2018

(54) ANNOTATING REAL-WORLD OBJECTS

(71) Applicant: Dassault Systemes SolidWorks Corporation, Waltham, MA (US)

(72) Inventors: Blake Reeves, Marlborough, MA (US); Eric Hasan, Westford, MA (US); Matthew Lorono, Broomfield, CO (US)

(73) Assignee: Dassault Systems SolidWorks Corporation, Waltham, MA (US)

( * ) Notice: Subject to any disclaimer, the term of this patent is extended or adjusted under 35 U.S.C. 154(b) by 356 days.

(21) Appl. No.: 14/947,828

(22) Filed: Nov. 20, 2015

(65) Prior Publication Data

US 2017/0147713 A1    May 25, 2017

(51) Int. Cl.
*G06F 17/50*    (2006.01)
*G06T 19/00*    (2011.01)

(52) U.S. Cl.
CPC ............ *G06F 17/50* (2013.01); *G06T 19/006* (2013.01); *G06T 2219/004* (2013.01); *G06T 2219/012* (2013.01)

(58) Field of Classification Search
CPC ................................ G06F 17/50; G06T 19/00
USPC .............................................. 703/1; 345/419
See application file for complete search history.

(56) References Cited

U.S. PATENT DOCUMENTS

| 2014/0282162 | A1* | 9/2014 | Fein ...................... G06F 3/0486 715/769 |
| 2015/0062123 | A1* | 3/2015 | Yuen ..................... G06T 19/006 345/420 |
| 2017/0249754 | A1* | 8/2017 | Fein ........................ G06T 11/00 |
| 2017/0301130 | A1* | 10/2017 | Kasahara ................ G06T 15/20 |

\* cited by examiner

*Primary Examiner* — Andy Ho
(74) *Attorney, Agent, or Firm* — Hamilton, Brooks, Smith & Reynolds, P.C.

(57) ABSTRACT

A computer-implemented method and system enables visualization of a computer-generated annotation on a real-world object in a real-world environment on a computerized system. The method and system creates a three-dimensional (3D) model of the real-world object, simultaneously displays the 3D model, the real-world object, and the real-world environment on a computer screen, and aligns the displayed 3D model and the displayed real-world object. The visibility of the 3D model is reduced and the 3D model is annotated in a real-world context. Reducing the visibility of the 3D model causes the annotation to appear on the displayed real-world object.

19 Claims, 5 Drawing Sheets
(3 of 5 Drawing Sheet(s) Filed in Color)

ANNOTATING REAL-WORLD OBJECTS

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to topological faces bounded by edges. Hereinafter, the terms vertex, edge, and face will be used interchangeably with their respective, corresponding geometric entities.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies. Parts and subassemblies are hereinafter collectively referred to as components.

CAD systems may also support two-dimensional (2D) objects that are 2D representations of 3D objects. Typically, two- and three-dimensional objects are used during different stages of a design process. Three-dimensional representations of a model are commonly used to visualize a model because the designer can manipulate the model in 3D space and visualize the model from any conceivable viewpoint. Two-dimensional representations of a model are commonly used to prepare and formally document the design of a model. Such documentation may include geometric dimensioning and tolerancing (GD&T).

A 2D representation of the 3D model is often referred to as a 2D drawing, or simply, a drawing. A 2D drawing contains one or more drawing views where, in general, each view illustrates the model in a specific orientation (e.g., top, front, or left side view), or illustrates a detail or section view of the model. Typically, the 2D drawing is used to communicate the design to a manufacturing engineer so that the physical object corresponding to the 2D drawing, and therefore, also corresponding to the 3D model, can be built.

Rather than using a 2D drawing to formally document the design of a model, a three-dimensional model may be used as the source of information relevant to documenting, communicating, and specifying product and manufacturing information (PMI). Hereinafter, such practice will be referred to as model-based definition (MBD). MBD is becoming a best practice in design and manufacturing, and may more clearly communicate information relevant to the design and manufacturing process than a 2D drawing (which may be cluttered with various views and annotations). Employing MBD technology, valuable PMI and GD&T may be stored with the 3D model and displayed with the 3D model. SolidWorks® 2015 3D CAD software, available from Dassault Systemes SolidWorks Corporation of Waltham, Mass., enables a user via MBD technology to annotate a 3D model and project the annotations in 3D space with respect to the 3D model.

Additionally, the MBD approach provides more context for manufacturing instructions. Two-dimensional drawings are often confusing not only because the difficulty some may have mentally constructing a 3D object from several 2D representations but also because the 2D drawings may have numerous annotations. The MBD approach removes the need for referencing separate, 2D drawing views. Further, an MBD approach may help prevent mistakes and misunderstandings during the design and manufacturing process, especially since during the design of a product, the design may likely be interpreted by different engineers.

Other fairly recent 3D modeling developments include placing a 3D model in a real world setting via augmented reality (AR), a technology that augments a real-world view with digital images and information. Images of a 3D model can be shown on a heads-up-display (HUD) or on a non-transparent display screen, such as one may find on a mobile device. In addition, real-world objects may be combined with the 3D model on a transparent or non-transparent screen. Thus, a HUD and a display screen can project a compilation of physical objects in the real-world (e.g., via a camera lens) and an image of a 3D model designed using a CAD system.

To add model-based definition annotations (e.g., GD&T) to a 3D model in an augmented reality environment, current state-of-the-art technology superimposes the annotations on an image of a real-world object. This method precludes any interaction with the 3D model in the context of a real-world environment.

Using 3D CAD systems, a model's size and appearance may be rendered as close to realistic as possible. This may be accomplished by adjusting the scale of the 3D model, applying a perspective projection to the 3D model, and using photorealistic rendering techniques to display the 3D model. A method that allows a user to view, create, and interact with MBD data in a real-world setting would further enhance the capabilities of a 3D CAD system with respect to making a 3D model appear as realistically as possible. The design and manufacturing industry would benefit from improved systems with enhanced capabilities that supplement real-world environments with MBD data via augmented reality and enable users to interact with the MBD data in a real-world environment.

SUMMARY OF THE INVENTION

In general, in one aspect, embodiments of the invention feature a computer-implemented method for visualizing a computer-generated annotation in a real-world environment on a computerized system. The method creates a three-dimensional (3D) model of a real-world object. The 3D model is a computer-generated model and can be annotated. The 3D model and the real-world environment are displayed simultaneously on a computer screen, where the 3D model appears within the real-world environment at a specified location and a specified scale. Also simultaneously displayed on the computer screen is a real-world object corresponding to the 3D model. The displayed 3D model and the displayed corresponding real-world object are aligned on the computer screen. The method also reduces the visibility of geometric entities of the 3D model so the 3D model is displayed less conspicuously than the corresponding real-world object; however, one or more annotations of the 3D model are displayed conspicuously. The method annotates the displayed 3D model in the displayed real-world environment, wherein annotation is displayed on the displayed real-world object as a result of the simultaneous display of the 3D model and the real-world object (and their relative levels of conspicuous display).

Other embodiments include selecting the real-world object at a location and referencing geometry of the 3D model corresponding to the selected location on the real-world object. Yet other embodiments include displaying the 3D model and the real-world environment simultaneously using augmented reality to project the 3D model and the real-world environment onto the computer screen. In another embodiment, prior to aligning the displayed 3D model and the corresponding displayed real-world object, the 3D model is translated to prevent overlap of the real-world object and a marker used to position the 3D model on the computer screen. Furthermore, aligning may be (a) accomplished manually using at least one of a user interface tool and an interactive device, (b) accomplished automatically using object recognition technology, and/or (c) accomplished by physically moving the real-world-object in the real-world environment. Moreover, aligning enables a location on the displayed real-world object to map to geometry defining the 3D model. To reduce the visibility of the geometric entities of the 3D model, embodiments may change the geometric entities to a transparent state or suppress the geometric entities from being displayed. Additionally the computer screen may be a heads-up display or a display on a mobile device.

Other embodiments include a computer-aided design (CAD) system having a processor operatively coupled to a data storage system and a data storage memory operatively coupled to the processor. In such embodiments, the data storage system stores a three-dimensional model, and the data storage memory comprises instructions to configure the processor to generate a three-dimensional (3D) model of a real-world object, simultaneously display on a computer screen the 3D model and the real-world object in a real-world environment, align the displayed 3D model and the displayed real-world object on the computer screen, reduce the visibility of geometric entities of the displayed 3D model causing the 3D model to appear fully or partially transparent, and display a computer-generated annotation, where the annotation annotates the 3D model and the annotation appears on the displayed real-world object due to the reduced visibility of the 3D model geometric entities. Embodiments may contain further instructions to configure the processor to (a) enable a user to select the displayed real-world object at a location, and (b) reference geometry of the 3D model corresponding to the selected location on the real-world object. Additionally, prior to aligning the 3D model and the corresponding real-world object, the 3D model is translated to prevent overlap of the real-world object and a marker used to position the 3D model. Moreover, an instruction to align the displayed 3D model and the displayed real-world object enables a location on the displayed real-world object to map to geometry defining the 3D model, and mapping the location of the displayed real-world object to geometry defining the 3D model enables an operation performed on the 3D model to appear as being performed on the displayed real-world object.

Yet other embodiments include a non-transitory computer-readable data storage medium comprising instructions that cause a computer to generate a three-dimensional (3D) model of a real-world object, simultaneously display on a computer screen the 3D model and the real-world object in a real-world environment, align the displayed 3D model and the displayed real-world object on the computer screen, reduce the visibility of geometric entities of the displayed 3D model causing the 3D model to appear fully or partially transparent, and display a computer-generated annotation where the annotation annotates the 3D model and appears on the displayed real-world object due to the reduced visibility of the 3D model geometric entities. In embodiments, further instructions cause a computer to enable a user to select the displayed real-world object at a location and reference geometry of the 3D model corresponding to the selected location on the real-world object. When embodiments of the invention simultaneously display the 3D model and the real-world object in the real-world environment, augmented reality is used to project the 3D model, the real-world object, and the real-world environment onto the computer screen. Additionally, embodiments prevent overlap of the real-world object and a marker used to position the 3D model by translating the 3D model prior to aligning the 3D model and the corresponding real-world object. Moreover, the instruction to align the displayed 3D model and the displayed real-world object enables a location on the displayed real-world object to map to geometry defining the 3D model, and the mapping of the location of the displayed real-world object to geometry defining the 3D model enables an operation performed on the 3D model to appear as being performed on the displayed real-world object.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same objects throughout the different views. The drawings are not necessarily to scale, emphasis instead being placed upon illustrating embodiments of the present invention.

DETAILED DESCRIPTION OF THE INVENTION

Figure 1A:
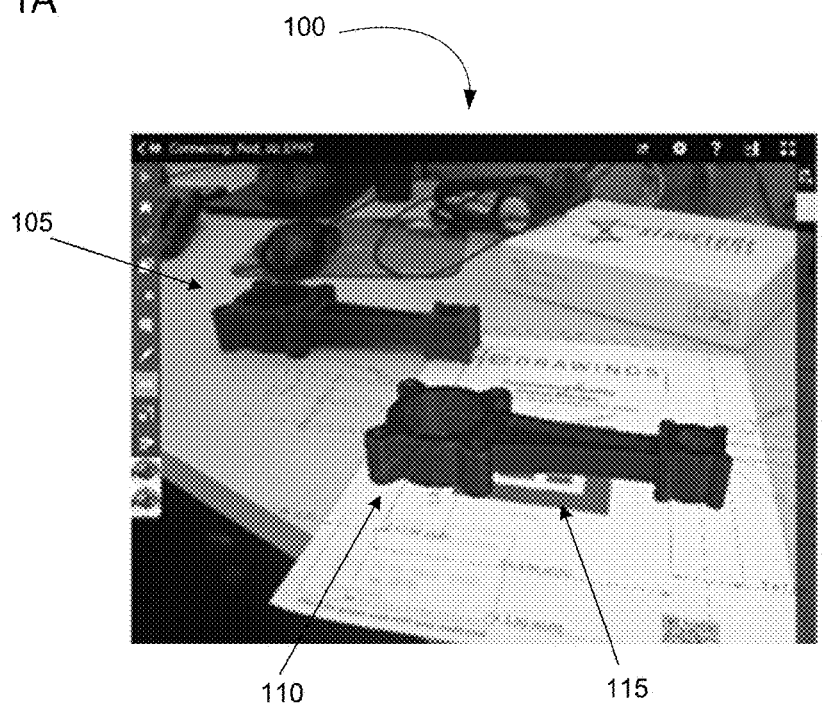
FIGS. 1A and 1B are illustrations of a real-world object and a 3D model displayed in the same real-world environment.

The present invention enables a user to visualize and author model-based definition (MBD) annotations in a real-world environment. Moreover, the annotations may be displayed on a real-world object. The present invention utilizes augmented reality (AR) viewed through a camera-equipped device (e.g., a tablet, a mobile phone, or wearable AR glasses) to produce an image of a real-world environment. In an embodiment, a real-world object is aligned with a transparent 3D model of the object. The user may reference the underlying geometry (including faces, edges, and vertices), and MBD features (such as holes, bosses, fillets, chamfers, cuts, shells, lofts, and sweeps), to review and annotate the model in a real-world environment. As a result, a user has the ability to (a) view MBD dimensions and tolerances on a real-world object in a real-world environment, (b) query model dimensions and tolerances and display the dimensions and tolerances on the real-world object, (c) use the real-world object to select geometry and features of the computer-generated 3D model using a model reference technique, (d) measure part geometry by referencing the 3D model geometry, (e) compare as-built aspects of a real-world object with as-designed aspects of a respective real-world object, and (f) create dimensions and other annotations, which are displayed in the real-world environment. Other annotations include, by way of non-limiting example, documentation conveying tolerances, call-outs, and collaborative notes specifying areas to focus on when manufacturing a part.

The present invention references a three-dimensional (3D) model and accurately associates geometric entities of the 3D model with corresponding aspects of a real-world object. In an embodiment, selecting a location on a real-world object (e.g., by tapping a finger on the computer screen or by using a stylus or a mouse device) causes a geometric and/or a feature of the real-world object to be highlighted.

Thus, a user may inspect and interrogate a real-world object in the real-world object's environment, providing easy access to important geometric information and context to dimensioning techniques. Users can refer to a real-world object rather than a 2D drawing and use augmented reality to supplement a 3D model's environment with important information rather than needing to view and query the 3D model within a separate interface.

Viewing a 3D model in a real-world environment imparts meaningful information to a user, whether the 3D model corresponds (is visually correlated) to an existing real-world object or not. Additionally, referencing geometry of a 3D model while viewing the 3D model and/or a corresponding real-world object in a real-world environment also imparts meaningful knowledge to a user. For example, after displaying a 3D model in a real-world 3D model's environment (as if the 3D model were the corresponding real-world object in real-world context), a design iteration of the 3D model may be proposed and annotations for additional inspection processes may be added.

Referring now to FIGS. 1A-D, an augmented reality (AR) view of a real-world environment 100 is shown in an embodiment of the present invention. The AR view 100 contains a real-world object 105. Additionally, a computer-generated 3D model 110, having dimensions that document the 3D model 110, has been opened and displayed in the AR view 100. The 3D model 110 is a model of the real-world object 105. A marker 115 positions the 3D model 110 in the AR view 100.

FIG. 1A shows the 3D model 110 scaled by a specified factor. The location of the 3D model is determined by the location of a marker 115. In an embodiment, to correctly scale the 3D model, the user verifies that the marker is a certain size (e.g., the size of a credit card). In FIG. 1A and the other figures that illustrate real-world object 105, real-world object 105 does not obscure the marker 115 because the marker 115 must be completely visible to a camera lens to project a computer-generated object into a real-world view such as AR view 100.

Figure 1B:
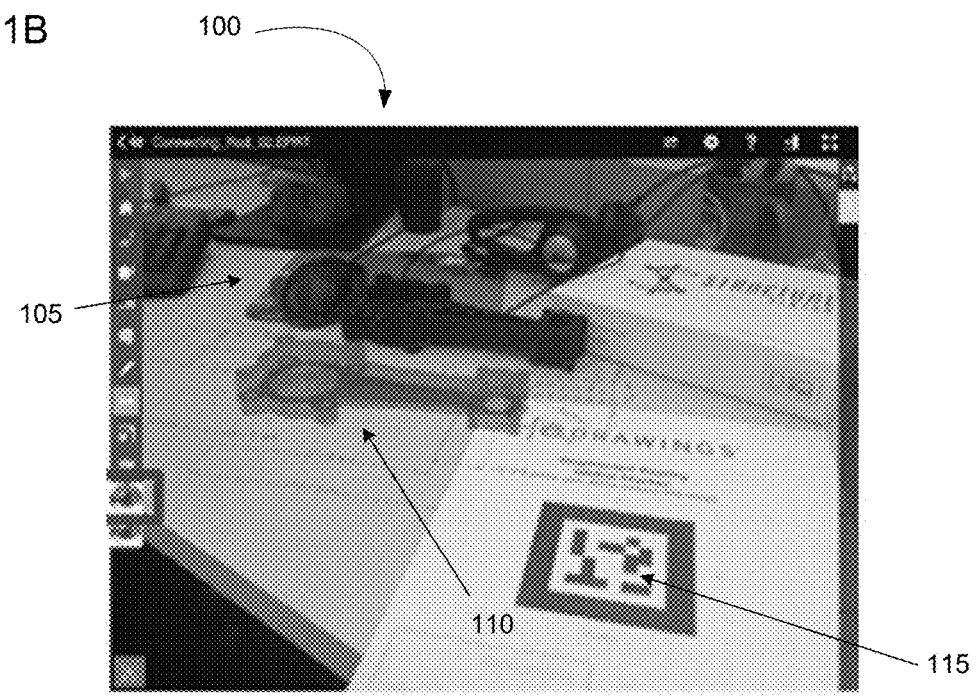

FIG. 1B shows the 3D model 110 in a transparent state and offset from marker 115. The dimensions in FIG. 1B annotate the 3D model 110 and are offset to a new location (compared to the location illustrated in FIG. 1A), along with the 3D model 110 because the dimensions are associated with geometric entities of the 3D model 110. The dimensions, unlike the 3D model, are not transparent. This may be accomplished by setting a transparency attribute for the 3D model geometry (geometry data) only and not for the 3D model annotations.

Figure 1C:
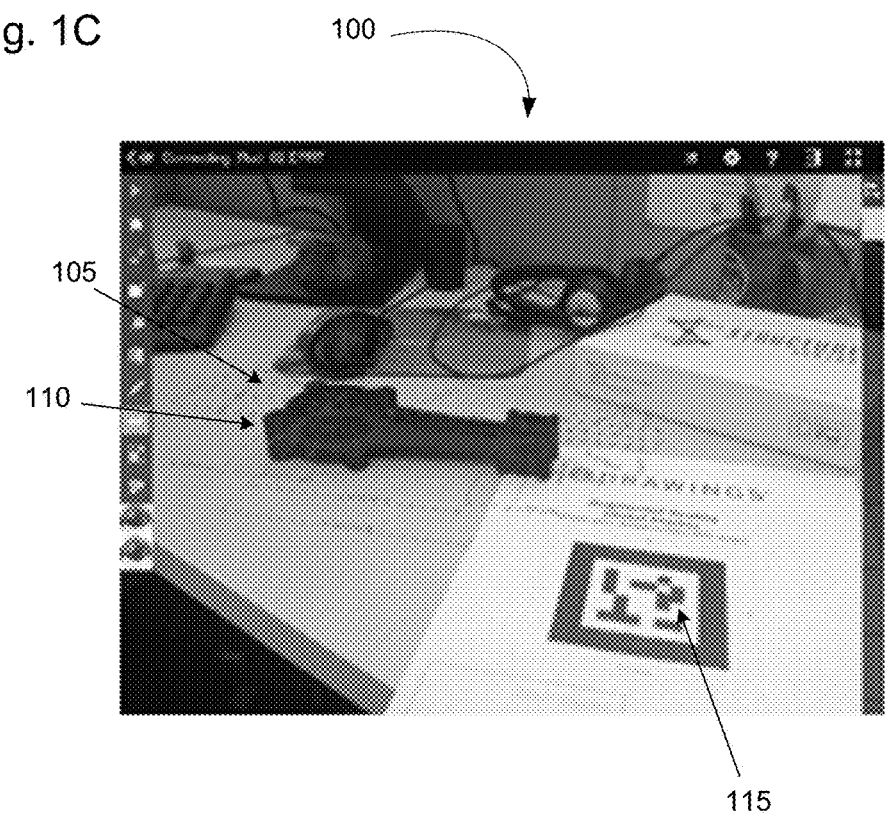
FIGS. 1C and 1D are illustrations of a real-world object with annotations generated from MBD data.

FIG. 1C depicts the alignment of the real-world object 105 and the 3D model 110. In an embodiment, the user moves the physical model (displayed as real-world object 105 in AR view 100) so that the physical model aligns with the 3D model 110. Alternatively, alignment may occur by automatically or manually moving the 3D model 110 to overlay the real-world object/physical model 105. To align the 3D model 110 manually, the user may use commonly available user interface tools and/or interactive devices to reposition the 3D model. To align the 3D model automatically, the computerized system may employ object recognition techniques that determine the size, shape, and/or color of objects, or edges thereof, and then reposition the 3D model 110 to align with the real-world object 105 on the display.

Aligning the real-world object 105 and the 3D model 110 involves applying an offset value to translate the 3D model 110 in AR view 100 away from the marker 115. This ensures that the real-world object 105 does not obscure the marker, and therefore, does not prevent the display of the 3D model 110. In an embodiment, a bounding box is generating and surrounds the 3D model 110. Then the bottom left corner of the bounding box is translated away from the marker 115, which in turn causes the 3D model 110 to translate away from the marker 115.

Figure 1D:
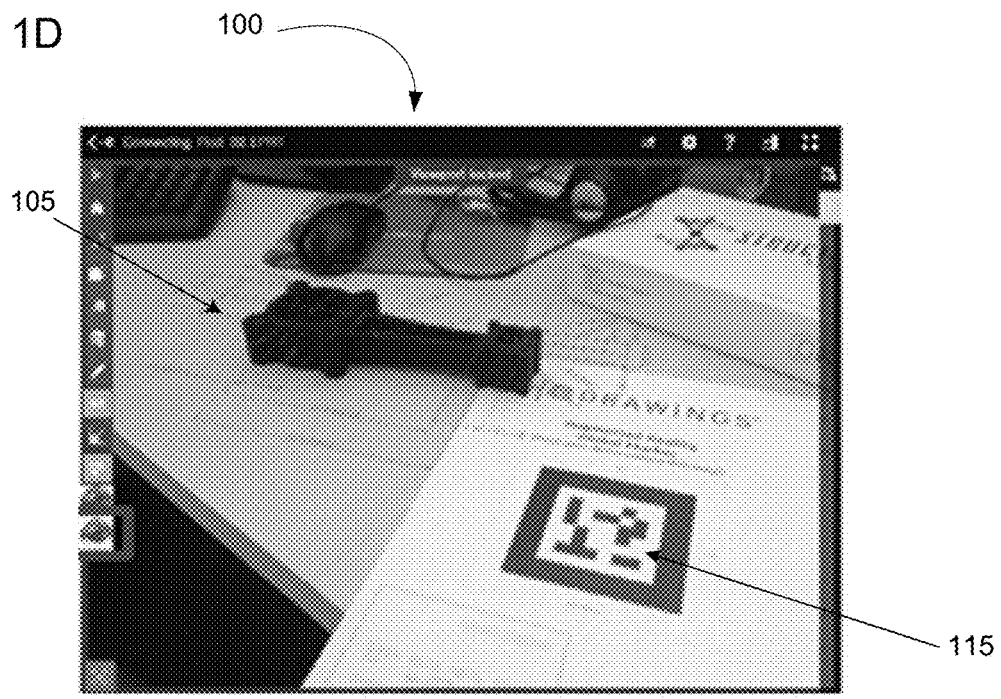

In FIG. 1D the 3D model 110 is not ascertainable because 3D model 110 is fully transparent. After the real-world object 105 and the 3D model 110 are aligned, the geometric entities of the 3D model 110 may be hidden (e.g., made totally transparent or suppressed from being displayed) while the dimensions remain in the AR view 100. Hiding the geometric entities of 3D model 110 may occur after the user initiates a command (e.g., via a user interface button) that triggers the removal of the geometric entities from the AR view 100. The geometry, however, is present in a data structure, and therefore may be selected by mapping a cursor location to a location of a geometric coordinate system in which the geometry is defined.

Figure 2:
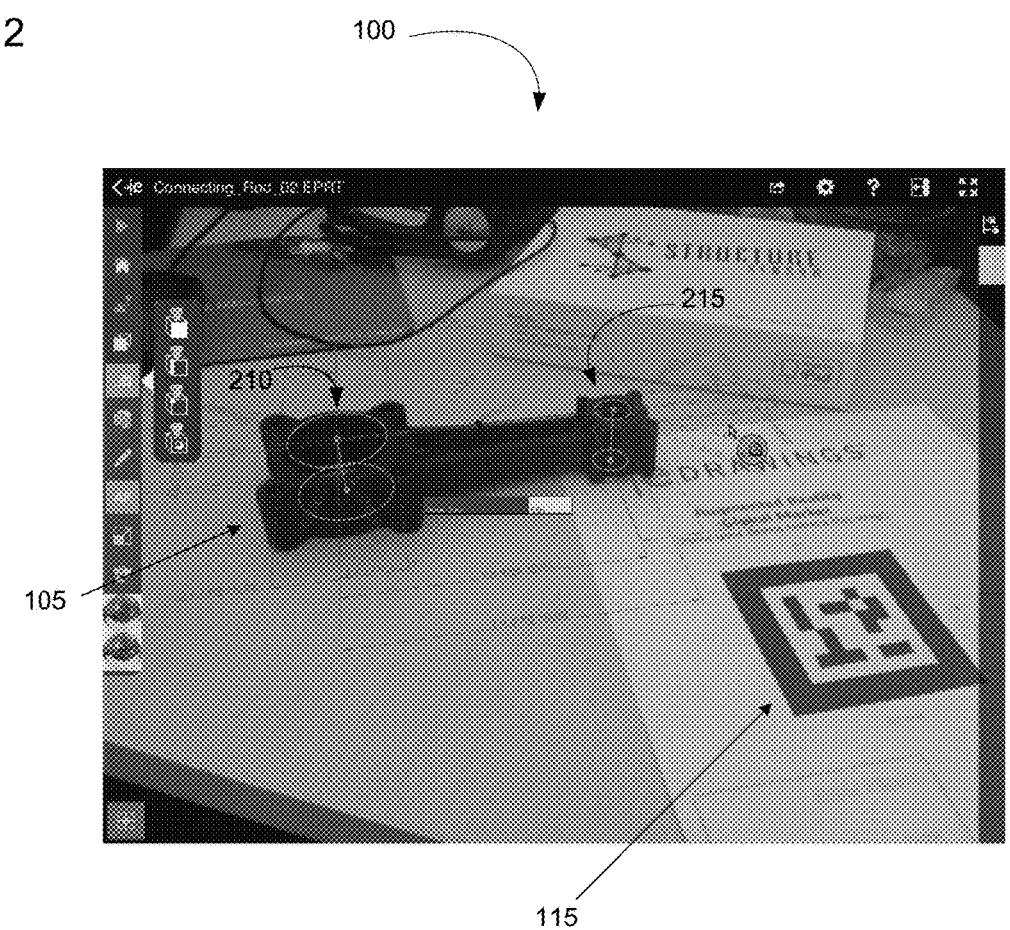
FIG. 2 illustrates highlighting and annotating real-world object features.

Referring now to FIG. 2, the real-world environment 100 is shown in which the real-world object 105 is being measured in an embodiment of the present invention. A large hole feature 210 and a small hole feature 215 were selected (e.g., user selected), as indicated by the highlighting of the selected features. Selection of the large hole feature 210 and the small hole feature 215 may occur by tapping a tablet device or activating a mouse button while a finger or a cursor, respectively, is located over the respective displayed hole features, for example. The present invention maps the selected location to the corresponding transparent geometry of the 3D model 110, then highlights the geometry to create the appearance of highlighting features on the real-world part.

Figure 3:
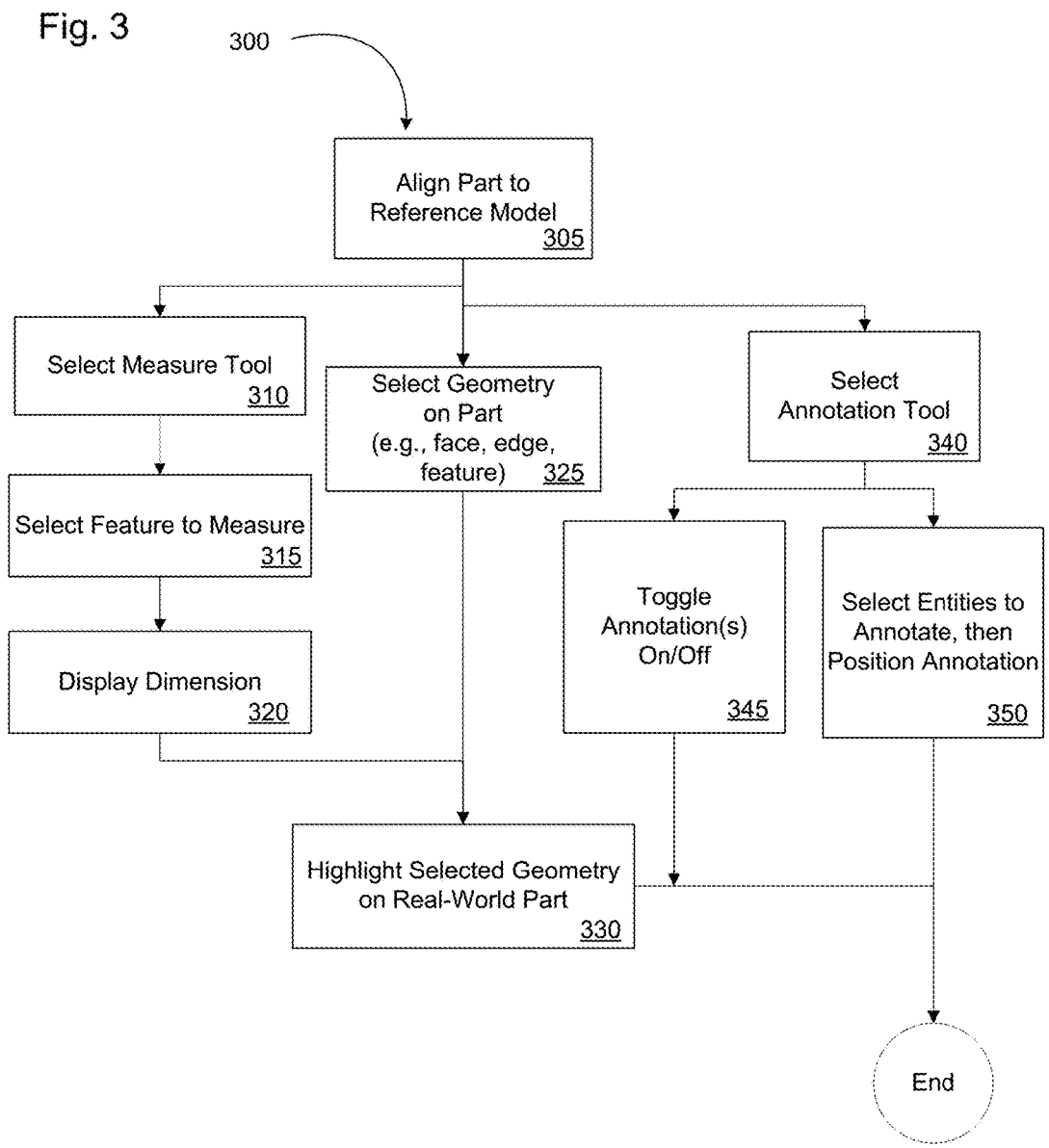
FIG. 3 is flow diagram containing steps for annotating and highlighting real-world objects.

Referring now to FIG. 3, a work flow (or computer-implemented process) 300 of an embodiment of the present invention is shown. In the first step, a real-world object is aligned to a computer-generated reference model (step 305). Alignment may occur as previously discussed, that is, by (a) moving the real-world object to the offset location of the computer-generated reference model, (b) manually moving the computer-generated reference model to the real-world object using interactive devices and/or user interface tools, and (c) automatically aligning the real-world object and computer-generated reference model without user intervention.

The user may decide to work with the real-world object in one of several ways. One way is to create a measurement of the real-world object by selecting a measuring tool (step 310). In this case the user then selects one or more features on the real-world object to measure (step 315). For example, a hole feature may be selected to measure the diameter of the hole feature, or two hole features may be selected to measure the distance between the centers of the two holes. The features are associated with geometry of the underlying reference model, which has been discussed. After selecting what to measure, a dimension is displayed in the augmented reality view to indicate the measurement (step 320). Additionally, the selected geometry in this embodiment may be highlighted (step 330) in the augmented reality view giving the appearance that the real-world object is highlighted although the selected geometry of the underlying 3D reference model is actually highlighted.

Another way in which the user may decide to work with a real-world object is to simply select a location on the real-world object (step 325), in which case, the geometry in the underlying reference model is highlighted (step 330). As discussed, this may give the appearance that a feature of the real-world object is highlighted. The user may wish to simply select the geometry to perform modeling or other operations such as collaboration operations, by way of non-limiting example.

Yet another way in which the user may work with the real-world object is to annotate the real-world object. To accomplish this, the user may first select an annotation tool (step 340). In an embodiment, all or some annotations may be toggled on and off (step 345) i.e., illuminated and dimmed respectively, in the augmented reality view. To turn only some annotations off, certain annotations may be selected from a list and then the display of the selected annotations is suppressed. The list may group the annotations by type so that certain types of annotations may be turned on and off. Examples of annotation types include dimensions, tolerances, and notes. Alternatively, each annotation may be toggled off and on individually.

The annotation tool also enables the user to add another annotation and choose a location for the annotation (step 350). For example, a dimension may be added by the user selecting one or more locations on the real-world object to dimension; the selected locations map to one or more geometric entities in a 3D reference model (e.g., faces, edges, and vertices). As discussed, a transparent reference model is aligned with the real-world object such that user-selected locations on a real-world object map to geometric entities in a transparent reference model. The user may then place the computer-generated dimension indicia in the augmented reality view by selecting locations in the real-world environment to position the dimension; the selected locations in the real-world environment map to the 3D space in which the reference model is defined and the locations of the dimensions are included with other model-based definition data associated with the reference model.

Figure 4:
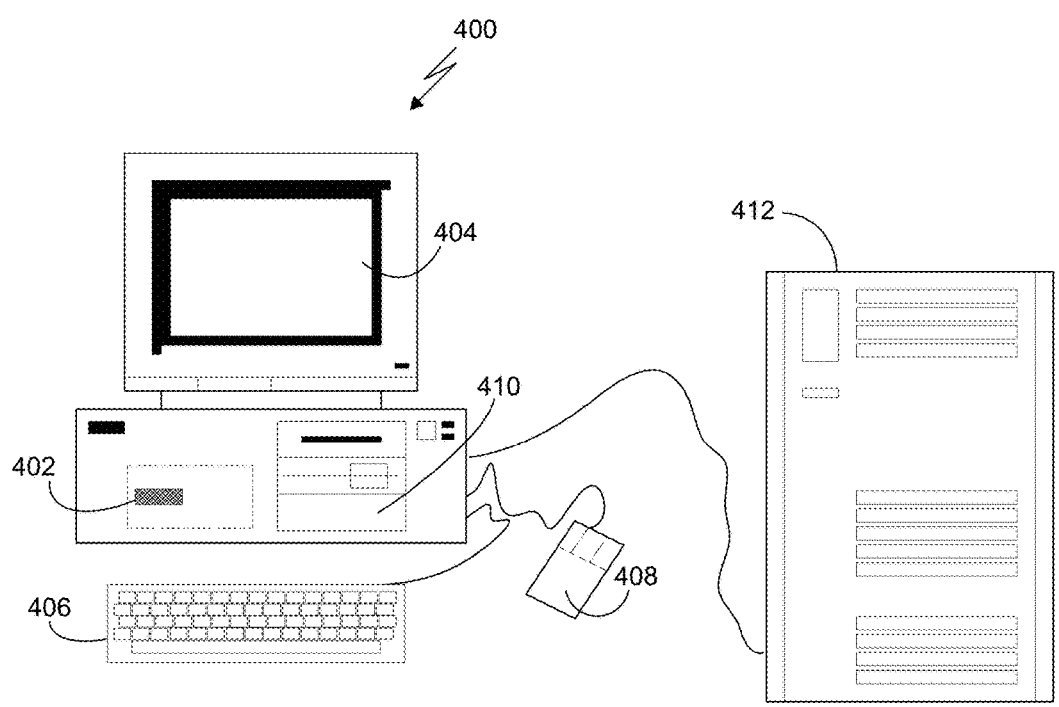
FIG. 4 is a schematic diagram of a computer system in which embodiments of the present invention may be implemented.

FIG. 4 illustrates a computerized modeling system 400, which may execute embodiments of the present invention. The computerized modeling system 400 includes a CPU 402, a computer monitor 404, a keyboard input device 406, a mouse input device 408, and a storage device 410. The CPU 402, computer monitor 404, keyboard 406, mouse 408, and storage device 410 can include commonly available computer hardware devices. For example, the CPU 402 can include an Intel-based processor. The mouse 408 may have conventional left and right buttons that the design engineer may press to issue a command to a software program being executed by the CPU 402. As an alternative or in addition to the mouse 408, the computerized modeling system 400 can include a pointing device such as a mouse, stylus, touch-sensitive pad, or pointing device and buttons built into the keyboard 406. Those of ordinary skill in the art appreciate that the same results described herein with reference to a mouse device can be achieved using another available pointing device. Other appropriate computer hardware platforms are suitable as is apparent from the discussion herein. For example, computer tablet systems may execute embodiments of the present invention. Such computer hardware platforms are preferably capable of operating the Microsoft Windows® 7, UNIX, Linux, MAC OS, and iOS operating systems.

Additional computer processing units and hardware devices (e.g., rapid prototyping, video, camera, and printer devices) may be included in the computerized modeling system 400. Furthermore, the computerized modeling system 400 may include network hardware and software thereby enabling communication to a hardware platform 412, and facilitating communication between numerous computer systems that include a CPU and a storage system, among other computer components.

Computer-aided modeling software may be stored on the storage device 410 and loaded into and executed by the CPU 402. The modeling software allows a design engineer to create, annotate, and modify a 3D model and implements aspects of the invention described herein (e.g., process 300). The CPU 402 uses the computer monitor 404 to display a 3D model and other aspects (e.g., model annotations, etc.) thereof as described. Using the keyboard 406 and the mouse 408, the design engineer can enter and modify data associated with the 3D model. The CPU 402 accepts and processes input from the keyboard 406 and mouse 408. The CPU 402 processes the input along with the data associated with the 3D model and makes corresponding and appropriate changes to that which is displayed on the computer monitor 404 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of computer systems, environments, and/or configurations that may be suitable for use with aspects of the invention include, but are not limited to, personal computers (PCs), server computers, hand-held and laptop devices, multiprocessor systems, microprocessor-based systems, set top boxes, programmable consumer electronics, mobile telephones and mobile operating systems, tablet computers, network PCs, minicomputers, mainframe computers, distributed computing environments that include any of the above systems or devices, and the like. The computer system may have standalone components or workstations, or the computer system may be formed of networked computers by any of known communications networks, processing networks, cloud-based networks, related protocols and the like.

As can be appreciated, the network can be a public network, such as the Internet, or a private network such as an LAN or WAN network, or any combination thereof and can also include PSTN or ISDN sub-networks. The network can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network is merely exemplary and in no way limits the scope of the present advancements.

Advantages of the present invention include allowing a user to view, create, and interact with MBD information in a real-world environment, enabling MBD information to supplement real-world objects and/or a real-world environment via augmented reality, and allowing a user to interact with the MBD information in a real-world environment.

Further advantages include reducing mistakes and miscommunications due to the creation and display of component and manufacturing information within a real-world environment in which a component is to be used. As discussed, annotations may be overwhelming and complicated in a 2D drawing; whereas, the present invention enables the user to better grasp and interpret the meaning of the annotations.

Another advantage is that a user may reference and measure as-designed geometry and visually compare that geometry to a corresponding piece of a real-world object. Further, a user of the present invention may not need to uninstall a part or sub-assembly of a real-world object to know certain dimensions of the real-world object since instead the user can display dimensions on the real-world object. Additionally, a user can use the present invention to understand how the part or sub-assembly is installed in a real-world object by aligning the real-world object with a 3D model representing the real-world object and highlighting different sub-assemblies in the 3D model and therefore in the real-world object as well.

Another advantage is that hardware devices such as scanning devices may be able to check tolerances and dimensions of a real-world object, which then may be automatically compared to respective tolerances and dimensions of a 3D model.

These advantages not only benefit CAD systems, including computer-aided software systems, but also various other software systems. For example, the present invention may be used to display a computer-generated version of a product in a user's home and analyze how the computer-generated version of the product will fit in a real-world setting given the dimensions of the computer-generated version of the product and dimensions of real-world objects in the user's home.

A number of embodiments of the present invention have been described. Nevertheless, it will be understood by those skilled in the art that various modifications may be made within the boundaries of the invention. For example, embodiments of the present invention may change the order in which operations are performed. Furthermore, depending on the needs of an implementation, particular operations described herein may be implemented as a combined operation, eliminated, added to, or otherwise rearranged. By way of non-limiting example, embodiments in which a 3D model and the real-world object are automatically aligned, the 3D model need not ever be displayed.

What is claimed is:

1. A computer-implemented method for visualizing a computer-generated annotation in a real-world environment on a computerized system, the method comprising:
creating a three-dimensional (3D) model of a real-world object, wherein:
the 3D model is a computer-generated model; and
the 3D model can be annotated;
displaying the 3D model and the real-world environment simultaneously on a computer screen, wherein the 3D model appears within the real-world environment at a specified location and a specified scale; and
displaying the real-world object corresponding to the 3D model on the computer screen, wherein the real-world object appears in the real-world environment simultaneously displayed with the 3D model;
aligning the displayed 3D model and the corresponding displayed real-world object on the computer screen;
on the computer screen, reducing the visibility of geometric entities of the 3D model to display the 3D model less conspicuously than the corresponding real-world object while one or more annotations of the 3D model are displayed conspicuously; and
annotating the displayed 3D model in the displayed real-world environment, wherein annotation is displayed on the displayed real-world object as a result of the simultaneous display of the 3D model and the real-world object.

2. The computer-implemented method of claim 1, further comprising:
selecting the real-world object at a location; and
referencing geometry of the 3D model corresponding to the selected location on the real-world object.

3. The computer-implemented method of claim 1, wherein displaying the 3D model and the real-world environment simultaneously uses augmented reality to project the 3D model and the real-world environment onto the computer screen.

4. The computer-implemented method of claim 3, wherein prior to aligning the displayed 3D model and the corresponding displayed real-world object, the 3D model is translated to prevent overlap of the real-world object and a marker used to position the 3D model on the computer screen.

5. The computer-implemented method of claim 1, wherein aligning is at least one of (a) accomplished manually using at least one of a user interface tool and an interactive device, (b) accomplished automatically using object recognition technology, and (c) accomplished by physically moving the real-world-object in the real-world environment.

6. The computer-implemented method of claim 1, wherein aligning enables a location on the displayed real-world object to be mapped to geometry defining the 3D model.

7. The computer-implemented method of claim 1, wherein to reduce the visibility of the geometric entities of the 3D model, the geometric entities are one of changed to a transparent state and suppressed from being displayed.

8. The computer-implemented method of claim 1, wherein the computer screen is one of a heads-up display and a display on a mobile device.

9. A computer-aided design system comprising:
a processor operatively coupled to a data storage system, the data storage system storing a three-dimensional model; and
a data storage memory operatively coupled to the processor and comprising instructions to configure the processor to:
generate the three-dimensional (3D) model, the 3D model being of a real-world object;
simultaneously display on a computer screen the 3D model and the real-world object in a real-world environment;
align the displayed 3D model and the displayed real-world object on the computer screen;
reduce the visibility of geometric entities of the displayed 3D model causing the 3D model to appear fully or partially transparent; and
display a computer-generated annotation wherein:
the annotation annotates the 3D model; and
the annotation appears on the displayed real-world object due to the reduced visibility of the displayed 3D model geometric entities.

10. The computer-aided design system of claim 9 further comprising instructions to configure the processor to:
enable a user to select the displayed real-world object at a location; and
reference geometry of the 3D model corresponding to the selected location on the real-world object.

11. The computer-aided design system of claim 9, wherein simultaneously displaying the 3D model and the real-world object in the real-world environment uses augmented reality to project the 3D model, the real-world object, and the real-world environment onto the computer screen.

12. The computer-aided design system of claim 9, wherein prior to aligning the displayed 3D model and the displayed real-world object, the 3D model is translated to prevent overlap of the displayed real-world object and a marker used to position the displayed 3D model.

13. The computer-aided design system of claim 9, wherein the instruction to align the displayed 3D model and the displayed real-world object enables a location on the displayed real-world object to map to geometry defining the 3D model.

14. The computer-aided design system of claim 13, wherein mapping the location of the displayed real-world object to geometry defining the 3D model enables an operation performed on the 3D model to appear as being performed on the displayed real-world object.

15. A non-transitory computer-readable data storage medium comprising instructions causing a computer to:
generate a three-dimensional (3D) model of a real-world object;
simultaneously display on a computer screen the 3D model and the real-world object in a real-world environment;
align the displayed 3D model and the displayed real-world object on the computer screen;
reduce the visibility of geometric entities of the displayed 3D model causing the 3D model to appear fully or partially transparent; and
display a computer-generated annotation wherein the annotation annotates the 3D model and appears on the displayed real-world object due to the reduced visibility of the 3D model geometric entities.

16. The computer-readable data storage medium of claim 15 further comprising instructions to causing a computer to:
enable a user to select the displayed real-world object at a location; and
reference geometry of the 3D model corresponding to the selected location on the real-world object.

17. The computer-readable data storage medium of claim 15, wherein simultaneously displaying the 3D model and the real-world object in the real-world environment uses augmented reality to project the 3D model, the real-world object, and the real-world environment onto the computer screen.

18. The computer-readable data storage medium of claim 15, wherein prior to aligning the 3D model and the corresponding real-world object, the 3D model is translated to prevent overlap of the real-world object and a marker used to position the 3D model.

19. The computer-readable data storage medium of claim 15, wherein:
the instruction to align the displayed 3D model and the displayed real-world object enables a location on the displayed real-world object to map to geometry defining the 3D model, and
the mapping of the location of the displayed real-world object to geometry defining the 3D model enables an operation performed on the 3D model to appear as being performed on the displayed real-world object.

* * * * *